(12) United States Patent
Lerner et al.

(10) Patent No.: US 7,271,074 B2
(45) Date of Patent: Sep. 18, 2007

(54) TRENCH INSULATION IN SUBSTRATE DISKS COMPRISING LOGIC SEMICONDUCTORS AND POWER SEMICONDUCTORS

(75) Inventors: Ralf Lerner, Erfurt (DE); Uwe Eckoldt, Hohenfelden (DE)

(73) Assignee: X-Fab Semiconductor Foundries AG, Erfurt (DE)

( * ) Notice: Subject to any disclaimer, the term of this patent is extended or adjusted under 35 U.S.C. 154(b) by 303 days.

(21) Appl. No.: 10/530,343

(22) PCT Filed: Oct. 8, 2003

(86) PCT No.: PCT/DE03/03332

§ 371 (c)(1),
(2), (4) Date: Apr. 6, 2005

(87) PCT Pub. No.: WO2004/034462

PCT Pub. Date: Apr. 22, 2004

(65) Prior Publication Data

US 2007/0105338 A1    May 10, 2007

(30) Foreign Application Priority Data

Oct. 8, 2002    (DE) ............................... 102 46 949

(51) Int. Cl.
*H01L 21/762*    (2006.01)
(52) U.S. Cl. ............................... 438/435; 257/E21.564
(58) Field of Classification Search ........ 257/E21.554, 257/564, 585, E21.589; 438/435
See application file for complete search history.

(56) References Cited

U.S. PATENT DOCUMENTS

| 4,871,689 | A | * | 10/1989 | Bergami et al. ............ 438/427 |
| 5,272,104 | A |   | 12/1993 | Schrantz et al. |
| 5,336,634 | A | * | 8/1994 | Katayama et al. .......... 438/406 |
| 5,445,988 | A |   | 8/1995 | Schwalke |
| 5,811,315 | A | * | 9/1998 | Yindeepol et al. .......... 438/405 |
| 5,877,065 | A | * | 3/1999 | Yallup ........................ 438/404 |
| 6,717,231 | B2 | * | 4/2004 | Kim et al. .................. 257/510 |
| 7,109,094 | B2 | * | 9/2006 | Chang et al. ................ 438/434 |
| 2001/0023974 | A1 |   | 9/2001 | McGregor et al. |
| 2004/0084414 | A1 | * | 5/2004 | Sakai et al. .................... 216/88 |

FOREIGN PATENT DOCUMENTS

EP    1184902 A1    3/2002

* cited by examiner

*Primary Examiner*—Matthew Smith
(74) *Attorney, Agent, or Firm*—Hunton & Williams LLP

(57) ABSTRACT

Disclosed is a layer arrangement (4b, 5b, 9b, 10, 9a, 5a, 4a) within an insulating trench, which insulates circuits with little distortion while being suitable for electrically insulating high-voltage power components (7) relative to low-voltage logic elements (6) that are integrated on the same chip (1, 2, 3). Also disclosed is the production of a sequence of alternating vertical layers in a trench (T). The electric strength for high voltages is improved while the influence of defects created by distortions of substrate disks is prevented.

21 Claims, 2 Drawing Sheets

State of the Art

TRENCH INSULATION IN SUBSTRATE DISKS COMPRISING LOGIC SEMICONDUCTORS AND POWER SEMICONDUCTORS

The present invention relates to an enhanced trench isolation and a production method for forming this isolation in a system including a substrate wafer and an active silicon layer to incorporate closely spaced high voltage power devices and low voltage logic elements. These trench isolations are incorporated into the substrate wafer and between the active silicon areas for power devices and logic elements, respectively.

Both devices belong to the same circuit and are provided as integrated devices. The integration of logic elements within the low voltage portion and a power element within the high voltage portion of the same silicon circuitry requires a separation of the electrical potentials. These potentials have to be insulated from each other, or to each other, to an extent as is required by the maximum applied voltage, representing a potential difference between these two potentials belonging to the aforementioned active silicon areas. One approach in this respect is a so-called dielectric trench isolation. Hereby, a vertically acting isolation is provided between the respective circuit element (the active silicon area) and the substrate by means of a buried layer, typically consisting of silicon dioxide (SiO2). Other types of insulating layers may also be used. In a later stage of the manufacturing process, according to prior art approaches, a laterally acting isolation is formed by means of a trench, which is, in the simplest case, accomplished by etching the trench between the two "active silicon areas." The trench extends down or into the buried insulating layer (to the layer) and is refilled with insulating material. In this way, the insulating barrier or the trench isolation is obtained.

Trench isolations are known from documents EP-A 1 184 902 (Matsushita) and EP-A 1 220 312 (F.T. Microelectronics), wherein only a part of the trench is filled with insulating material, while a remaining volume is coated or filled with a filler material, which may even be electrically conductive. For this purpose, polysilicon is suggested. Due to a difference in the coefficient of thermal expansion of the usually-used materials, such as a silicon active layer, SiO2 as an insulator, and polysilicon as a fill layer, the thickness of the insulating layer may not be selected to be arbitrarily large. Owing to the different thermal expansion, a non-tolerable bending of the silicon wafer would be created, thereby compromising the processability to an extent which would hardly allow the further processing of the silicon wafer. For these reasons, the thickness of the insulating layer within conventional trenches is limited. If an increased resistance against electrical breakthrough is required, this may not result in an increased trench width, but may require that several trenches are arranged next to each other, i.e., connected in series, within the silicon and are inserted between the two active silicon areas. Consequently, more space is required on the substrate or silicon wafer. In addition to the type, thickness and homogeneity of the insulating layer within the trench, the structure of the sidewalls of the trench or trenches also affects the lateral electrical breakthrough voltage that may be achieved. Silicon protrusions and corners have to be avoided, since these may lead to electrical field concentrations, which, in turn, would reduce the insulation capability of one or more trenches connected in series.

It is an object of the present invention to save on precious chip area (substrate area) and to reduce the trench width (total width) of a system of isolation trenches. At the same time, the reliability of the trench isolation with respect to lateral existing high voltages should be increased.

According to the present invention, the object is solved as a technical problem in that, in a trench of increased width, an alternating series of a plurality of insulating layers and fill layers is provided, wherein the composition of the layers (fill layers and insulating layers) is selected such that, averaged over all layers, in toto, a thermal expansion is achieved across the area of the trenches, which is close to the thermal expansion of the semiconductor wafer, i.e., usually the thermal expansion of silicon (claims 1, 9 and 10).

In this way, the creation of an undesired bending of the substrate wafer upon a thermal stress of semiconductor devices formed in a later stage together with the semiconductor devices associated with the neighboring "active silicon areas" may be avoided. Furthermore, manufacturability is maintained in that the undesired bending during the processing is avoided. Thereby, the risk of creating (generating) crystalline defects is also reduced, or such defects are avoided. Consequently, an increased production yield may be obtained.

The insulating layers having, in toto, an increased thickness, result in a significant increase in the achievable breakthrough voltage in the trench of increased width. It has been found that non-uniformities existing within the sidewalls of the trenches may not significantly affect the achieved breakthrough voltage of the inventive trench systems.

By means of the plurality of fill layers and the plurality of insulating layers provided, a possibility is offered to adjust the thermal expansion of the total structure in the trench, thereby bringing the thermal expansion close to that of the silicon, which represents a preferred semiconductor. In other words, the thermal expansion of the trench having the vertical layer sequence and the thermal expansion of the surrounding semiconductor are substantially identical, or are at least adapted to each other, such that no inadvertent bending of the substrate wafer is created (claim 5).

Layers comprised of silicon dioxide or SiN may be used as the insulating layer (claim 2). As fill layers, layers comprising polysilicon in their base material (claim 3) may be used.

Preferably, the insulating layers within the trench may be comprised of different substances (claim 21). If a trench is referenced, it is that which is first formed, in particular, etched, between the two active silicon areas. This trench is, in the course of the manufacturing procedure, filled with vertically oriented layers in the form of a layer sequence or a layer stack, and is then, in its final arrangement, no longer a trench, but, instead, represents a trench isolation extending into the depth of the wafer, wherein the trench isolation is located at the height of both active silicon areas, which are, in this case, adjacent to each other, one of them dedicated to a low voltage logic element, while the other is dedicated to a high voltage power element. Due to the origin of the trench, the terminology referring to a trench which is filled in the sense of "trench isolation" by an insulating material (claim 4) is, nevertheless, used.

The filling of the trench represents the inventive structure (claims 1, 9). The manufacturing is achieved by the temporarily subsequent formation of layers being substantially vertical or parallel to the trench walls, wherein the layers comprise more than two insulating layers and at least two, but preferably more, fill layers. Hereby, an even number of insulating layers and an odd number of fill layers is provided at oppositely arranged trench walls, now resulting in a sequence of insulating layers and fill layers in an alternating fashion. This alternating sequence of layers offers the opportunity to more precisely adapt the thermal expansion to that of the silicon wafer or the base material silicon. If a different semiconductor material is provided for the wafer, the concept of the present invention may readily be applied to the different semiconductor crystal or the different semiconductor material used as a substrate.

When forming an isolation trench (claim 10), first, the trench may be, for example, formed by using a patterned photoresist layer and a plasma etch process. This trench is the reason for the terminology used. Thereafter, a first insulating layer, for example, comprised of SiO2, is formed within the trench by, for instance, a CVD process or by a thermal oxidation.

Next, a first fill layer is deposited between the previously formed insulating layers, for instance, by a CVD process. After the deposition of the first fill layer, which occupies the space between the insulating layers, at this stage completely filling the trench, a portion of this layer is removed so as to expose a portion of the trench bottom, which preferably consists of the buried insulating layer providing vertical insulation of the opposing active silicon area. The fill layer at the trench bottom is removed in such a way that a new, more narrow, trench is formed, which again, may be used to receive further insulating layers, which may be vertically deposited or grown on the newly-formed walls of the trench of reduced width.

By removing the fill layer at the trench bottom, the formation of a conductive channel at the trench bottom is prevented, which could otherwise short any subsequently provided insulating layers. The removal of the portion of the fill layer may be accomplished by, for instance, a well-established anisotropic etch process. By means of this anisotropic etch process, the fill layer on the top surface of the silicon wafer may also be removed.

Thereafter, a further deposition of an oxide is performed, thereby forming a further insulating layer which extends across the horizontal regions, as well as into the newly-created trench of reduced width. The insulating layer forms two parallel layer sections within the trench, which are substantially vertically oriented, i.e., parallel to the trench walls. The formation of this further insulating layer, i.e., with respect to the trench walls, the formation of two oppositely arranged sections of insulating layers, which are also referred to as "layers," may be accomplished by thermal oxidation of the internally exposed polysilicon (in the form of oppositely arranged fill layers).

The horizontally expanding oxide layer newly formed above the trench may have an additional function. This layer may act as a stop layer for a final planarization of the surface or a smoothing thereof.

This smoothing or planarization process, however, is performed only after filling-in a further fill layer between the trench walls that have been newly formed and that are substantially vertically arranged so as to define an even more reduced distance between the trench walls, wherein the filling-in may be performed similarly as is described above (chemical vapor deposition, CVD). When the layer also has a horizontal extension above the trench, this portion may be removed during the removal process for planarizing the surface, possibly together with the lower lying stop layer, wherein due to the removal process during smoothing of the surface, a significant reduction of the etch rate is obtained due to the presence of the stop layer.

Finally, after planarizing the surface, this insulating oxide layer may be removed in a conventional manner, so that the layer sequence within a trench is immediately observable, wherein the alternating sequence of electrically insulating insulation layers alternatingly provided to the fill layers occupy the total original trench width, thereby providing an enhanced insulation capability when compared to an original trench of increased width according to the prior art technique.

At the same time, due to the increased number of layers within the trench, there is the possibility to more precisely adjust the thermal expansion of the trench filling so as to avoid inadvertent bendings of the substrate or the substrate wafer.

The sequence of inserting layers into the trench may be inverted, that is, the fill layer is first deposited and opened (restricted), with insulating layers subsequently being formed on the inner walls of the restricted (in width) fill layer.

Exemplary embodiments of the present invention will provide a more detailed description and a deeper understanding, wherein schematic sketches are referred to.

In principle, the figures are self-explanatory and require no further explanation. Nevertheless, reference should be made to the detailed discussion of the process sequence in the introductory part of the description, which is used in this particular embodiment.

Figure 1:
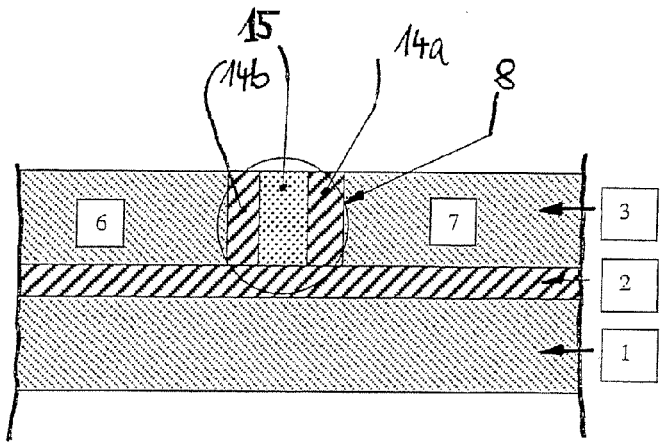
FIG. 1 is a cross-sectional view of a conventional arrangement of an isolation trench in the form of an isolation trench having three vertical layers within the trench. The isolation trench is highlighted within the circle in a symbolic manner and is represented by 8.

The prior art according to FIG. 1 is described as follows.

A substrate wafer 1 comprised of substrate material, such as silicon, has formed thereon a buried electrically insulating layer 2, comprised of, for instance, silicon dioxide (SiO2), in the form of a "buried oxide" (BOX). Two active silicon areas associated with a first potential 1 and a second potential 2 are denoted as 6 and 7, and may be provided for receiving a low voltage logic element within the area 6 and a high voltage power element within the area 7. The areas 6 and 7 are provided within an active silicon layer 3, wherein merely a portion of the wafer is shown so as to more clearly illustrate the arrangement and structure of the trench 8. The trench 8 has formed on its trench walls insulating layers 14A, 14B, respectively, and, interposed therebetween, a fill layer 15, so as to completely fill the trench and to endow the trench with insulating characteristics for the two different potentials of the active silicon areas 6 and 7. These areas may be integral parts of a circuit ("silicon circuit") formed in the silicon, wherein the circuit is not shown.

Figure 2:
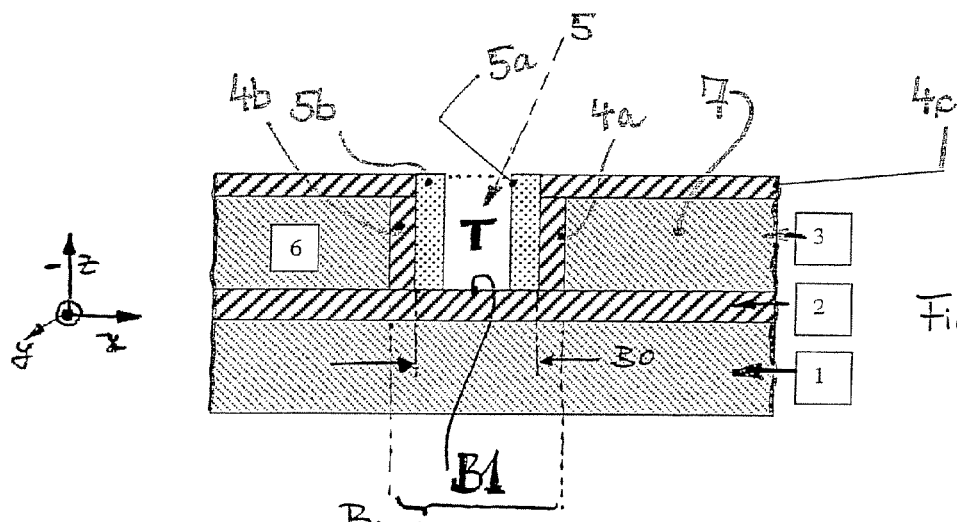
FIG. 2 is a cross section of an embodiment of the present invention in a first step after inserting a first fill layer.

FIG. 2 illustrates a stage of manufacturing an isolation trench or a trench isolation, after the completion of several process steps, which, however, are apparent from the depicted results without further explanation.

Illustrated here is the same substrate in the form of substrate wafer 1, for example, comprised of silicon, a buried electrically insulating layer 2, for instance, in the form of SiO2 (BOX), and the overlying active silicon layer 3 in the form of a "device wafer". Also illustrated is the active silicon area of the first potential located on the left hand side and indicated by reference number 6, and the second active silicon area located on the right hand side with reference number 7, which will be operated with different potentials after completing the semiconductor and operating the same, wherein the potentials are insulated from each other.

According to FIG. 2, a first trench T is already incorporated between the two active silicon areas 6, 7, wherein the trench has a width that may be identified by means of the trench bottom B, wherein the trench T extends down to the electrically insulating buried layer 2. A trench may be formed by means of a plasma etch process using a patterned photoresist layer. Thereafter, a first insulating layer of the sequence, for instance, comprised of SiO2, is incorporated by means of, for instance, a CVD process or a thermal oxidation process. This insulating layer is, in its horizontal portion (on top of the active silicon areas 6, 7), denoted as 4c and is indicated in the two vertical portions initially covering the trench walls as layers 4a, 4b, which are shown to be oppositely arranged and which extend down to the trench bottom B that is formed by the surface of the buried insulating layer 2.

Thereafter, a first fill layer has been formed and is generally denoted by 5, wherein the layer may, for example, be formed by a CVD process. The deposition resulted in the filling of the entire trench T between the two insulating layers 4a, 4b, thereby covering the bottom surface of the remaining trench bottom B0, having a width that corresponds to the initial width of the bottom B reduced by the thickness of the two insulating layers 4a, 4b.

The fill layer 5 was removed down to the bottom of the trench, thereby forming an opening which is again denoted in FIG. 2 by reference number T and represents a new trench, which is open in the upward direction. Hereby, a conductive channel at the trench bottom B1 may be avoided, which would otherwise short subsequent insulating layers. This may advantageously be accomplished by, for instance, a commonly known anisotropic etch process. Preferably, during this process the fill layer on the surface of the silicon wafer has also been removed, so that the wafer merely bears the oxide layer 4c according to the stage of manufacturing as depicted in FIG. 2.

In FIG. 2, a restriction of the initially incorporated fill layer 5 is shown so that two lateral surface portions 5a, 5b are provided in the form of layers, which are represented as oriented in a parallel manner with respect to the initial and newly-formed trench walls. Their width is—in toto—less than the initial width of the fill layer 5.

Hence, the initial fill layer 5 is no longer provided in a region of the trench bottom, which is indicated by B1, wherein this new trench bottom B1 is smaller (more narrow) compared to the preceding trench bottom B0, and is also smaller than the initial trench bottom B. The ratio of the width of the respective bottoms of trench T may be readily identified in FIG. 2.

Figure 3:
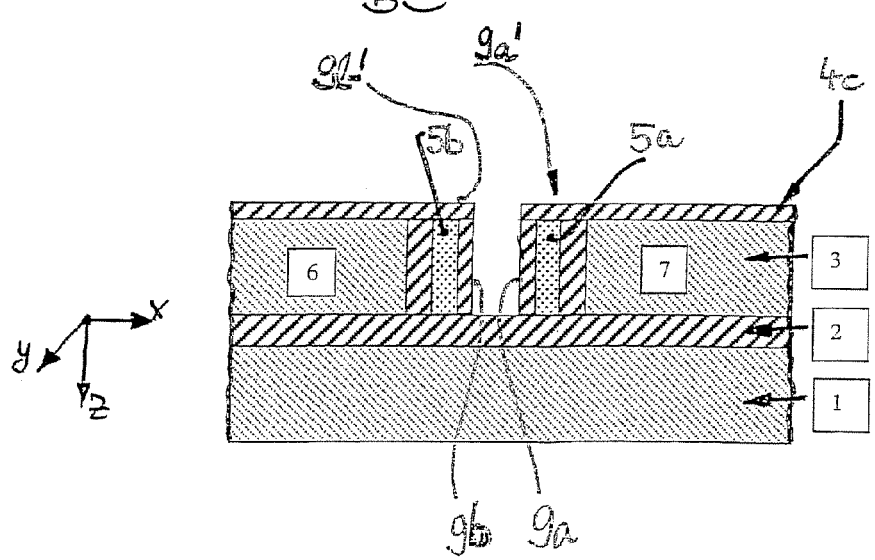
FIG. 3 is an advanced manufacturing stage after the insertion of a second insulating layer in the form of a layer pair 9A, 9B on the inner sides of the fill layers, 5A, 5B, according to the preceding figure.

FIG. 3 shows a cross-sectional view of a further advanced stage of the manufacturing process, i.e., after the formation of a second insulating layer. The second insulating layer comprises a plurality of portions, that is, two horizontal portions 9a', 9b' and two vertical portions 9a, 9b. The horizontal portions are adjacent to the current horizontal insulating layer 4c and are located above the fill layers 5a, 5b of FIG. 2; alternatively, the horizontal portions are oxidized into these fill layers to a certain degree, similar to the vertical layers 9a, 9b located within the trench, which may also have been oxidized to a certain degree into the fill layers 5a, 5b of FIG. 2. For this reason, the height and width of the fill layers 5a, 5b shown in FIG. 2 are reduced.

In FIG. 3, however, these layers are still indicated by the same reference signs.

By means of this further oxide deposition 9a', 9a, 9b, 9b', the second insulating layer is formed. The oxidation process is a thermal oxidation of the polysilicon, which may, for instance, be used for the first fill layer with its remaining layers 5a, 5b.

Figure 4:
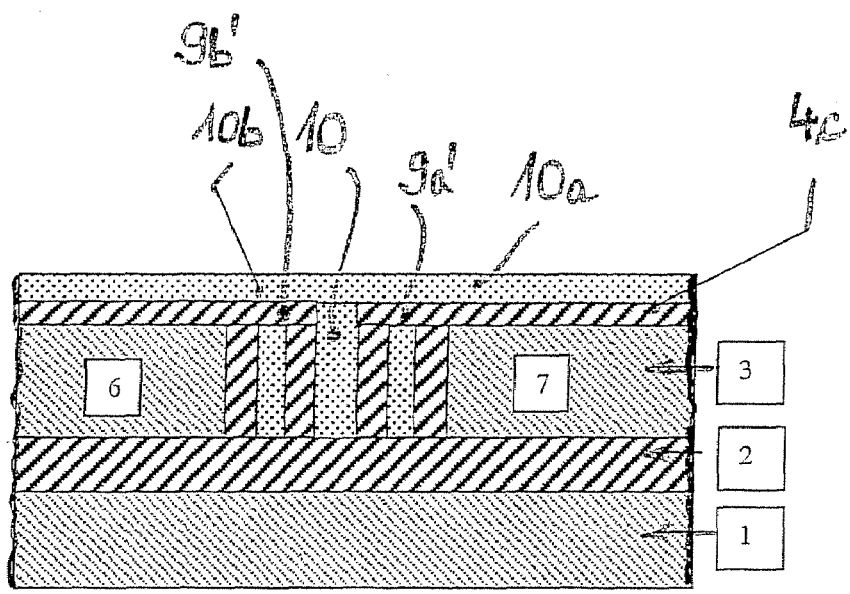
FIG. 4 is a further step in the manufacturing process after inserting a second fill layer 10 between the two insulating layers of the preceding figure.
Figure 5:
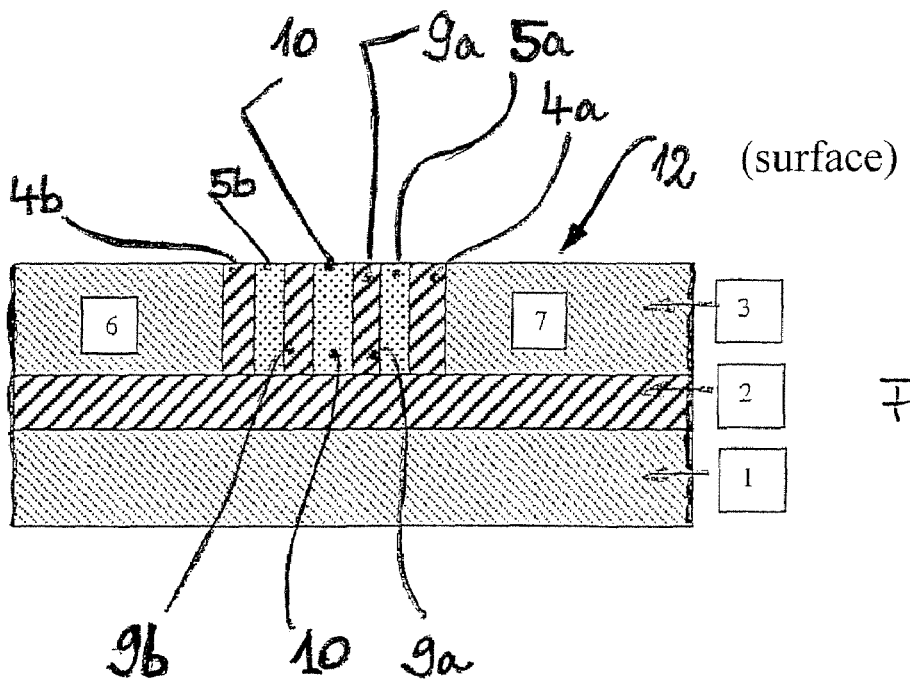
FIG. 5 is a cross-sectional view of a trench assembly after a further step in the manufacturing process, that is, after the planarization of the surface.

In a further advanced stage of manufacture, which is represented in FIG. 4, there is provided a second fill layer 10, 10a, 10b, which may also comprise polisilicon. This fill layer includes horizontal portions 10a, 10b, located above the previously identified insulating layer 4c, 9a', 9b', and a vertical portion 10, completely filling the residual trench such that the entire trench T is filled. Since an insulating layer is located below the horizontal portion of the second fill layer, i.e., the top surface of the structure, this insulating layer may be used as a stop layer for a final surface planarization or a final smoothing process. The presence of the stop layer results in a significant reduction of the etch rate in a removal process during smoothing of the surface. After this step of planarizing, the second insulating 4c, 9a', 9b' may also be removed in a well known (common) manner, so that a stage of the manufacturing process is achieved as is represented in FIG. 5. Here, the structure of the isolation trench after the planarization process is shown, wherein the trench comprises an alternating sequence of insulating layers and fill layers, each of which is vertically arranged within the trench and has a width that is less than the initial trench width of the initial trench bottom B according to FIG. 2. It is evident that an odd number of fill layers and an even number of insulating layers is provided. At least seven such alternating layers are provided.

Depending on the magnitude of the voltage to be insulated, the process flow, described with reference to FIGS. 2, 3, and 4 before the final step of planarizing according to FIG. 5, may be repeated once or several times.

The dependence on the voltage which has to be blocked during operation determines, on the one hand, the width of the trench and, on the other hand, the number of layers used (insulating layer and fill layer). Hereby, the respective fill layer 10, which has been incorporated as the last layer, is opened within the trench from above until the layer is removed from the trench bottom, which has a less lateral extension compared to the trench bottom existing prior to the incorporation of the fill layer. Due to this process, two new (more narrow) fill layers are again formed, corresponding to those layers 5a, 5b that are provided laterally at the trench walls after opening the incorporated fill layer 5. Similar to the oxide layers described above, further oxide layers will be incorporated into these new trench walls, according to FIG. 3, to be followed by a filling-in with still a further layer according to FIG. 4, which may additionally have a horizontal portion 10a, 10b on the left hand side and the right hand side of the vertical trench portion 10. If no further step sequences according to FIGS. 2, 3 and 4 are added, the complete filling of the trench according to FIG. 4 may be completed by the step of planarizing as described with reference to FIG. 5.

The layers in an alternating sequence of a fill layer, an insulating layer, a fill layer, . . . , may have a different thickness (in a transverse direction with respect to the trench length direction), corresponding to the width of the trench.

These layers may also comprise different materials, for instance, the insulating layers may comprise silicon dioxide and/or silicon nitride, SiN.

As is evident from the sequence of FIGS. 2 to 4, the respective exposed trench bottom is increasingly reduced, starting from the initial width via the trench bottom portions B0, B1, . . . , until the trench bottom is completely covered by the last fill layer 10 that is incorporated into the interior of the trench. In this way, the trench T is reduced in width in a stepwise manner. Nevertheless, reference is made to the trench T, which has a differing trench width (x-direction) during the course of the manufacturing process and, thus, a differing width of the respective exposed trench bottom is generated. Consequently, the trench walls differ from each other and these different trench walls approach each other during the course of the process while receiving new vertical layers, which are formed either by an insulating layer or by the incorporation of a fill layer and a subsequent restriction of the fill layer. With each new process sequence according to FIGS. 2, 3 and 4, respective two further insulating layers are incorporated in addition to a respective further fill layer.

If a further sequence of process steps is subsequently to be performed, the inner most fill layer is opened and again a pair of insulating layers is provided on the resulting new trench walls followed by a further fill layer, which may be opened again, if desired. This process of opening will be referred to as "restricting," whereby the width of the fill layer is restricted and two new layer portions are provided, which are vertically arranged and define new trench walls.

Each process of restricting extends down to the bottom of the trench, which, in turn, is formed by the BOX layer, and the new trench walls are located more closely to the center of the trench compared to the previously existing trench walls, which were covered by the preceding insulating layers.

We claim:

1. An isolation trench in a substrate material for electrically insulating high voltage power elements integrated in combination with low voltage logic elements into the same silicon circuit in a substrate wafer (trench isolation), said trench being partially filled with electrically insulating material and partially with a fill material, said trench extending to an electrically insulating layer located at least at the bottom of said trench, wherein
   (i) within said trench an alternating sequence or alternatingly electrically insulating layers (insulation layers) and fill layers are provided with a parallel orientation with respect to trench walls;
   (ii) the plurality of insulating layers and fill layers are composed such that with respect to a sum over all parallel layers within said trench a coefficient of thermal expansion of the sum of layers is adjusted so as to be at least close to a coefficient of expansion of the substrate materials, thereby avoiding a bending of the substrate wafer.

2. An isolation trench according to claim 1, wherein the insulating layers are comprised of silicon dioxide.

3. An isolation trench according to claims 1 or 2, wherein the plurality of fill layers comprise polysilicon within their base material.

4. An isolation trench according to claim 1, wherein the entire trench in said substrate material is filled with said insulating layers and fill layers.

5. An isolation trench according to claim 1, wherein said coefficients of thermal expansion are adapted to each other in such a way that an inadvertent bending of the substrate wafer (upon thermal stress) is avoided.

6. An isolation trench according to claim 1, wherein at least seven parallel layers are provided within said trench.

7. An isolation trench according to claim 1, wherein the inner most layer of the filled trench is a fill layer.

8. An isolation trench according to claim 1, wherein all of the layers within said trench are exposed at the trench top surface and are particularly planarized or smoothed.

9. An isolation trench within a substrate material of a substrate wafer for laterally electrically insulating (trench isolation) a first active semiconductor area provided for the formation of a high voltage power element, with respect to a second active semiconductor area, provided for the formation of at least one low voltage logic element, both elements being commonly integrated into the same silicon circuit, said trench extending down to an electrically insulating layer that is at least located at a bottom of said trench, said electrically insulating layer preferably being provided below said active areas for a vertical electrical insulation, wherein
   (a) within said trench an alternating sequence of or alternatingly electrically insulating layers (insulation layers) and fill layers are provided in a substantially parallel orientation with respect to trench walls;
   (b) the plurality of insulating layers and fill layers are composed and configured such that in a sum over all parallel layers provided within said trench, a first coefficient of thermal expansion of the layer stack is adjusted so as to be at least close to a second coefficient of expansion of the substrate materials so as to at least reduce and preferably substantially completely avoid bending of the substrate wafer upon thermal stress.

10. An isolation trench according to claims 1 or 9, wherein the insulating layers within said trench are formed of different materials or at least some of the layers are formed of different materials.

11. A method of manufacturing at least one isolation trench for electrically insulating high voltage power elements, which are integrated into the same silicon circuit along with low voltage logic elements, said trench being filled to a first part with electrically insulating material and to a second part with a fill material in the form of layers, said trench extending to or into an electrically insulating layer, wherein
   (i) after depositing a first insulating layer covering trench walls, a first fill layer is incorporated and restricted such that the fill layer is not present on a trench bottom;
   (ii) thereafter a second insulating layer and following this layer a second fill layer is incorporated into said trench;
   (iii) a planarization and smoothing (planarizing) of at least a trench surface is performed.

12. A method according to claim 11, wherein silicon dioxide layers are incorporated into said trench as insulating layers.

13. A method according to claim 11, wherein such layers are incorporated into said trench as fill layers, which comprise polysilicon in their base material.

14. A method according to claim 11, wherein at least one of the insulating layers is formed by oxidizing the fill layers comprising polysilicon within their base material.

15. A method according to claim 11, wherein a finally formed insulating layer is used as a stop layer for removal of an overlying layer at a lateral portion outside of said trench.

16. A method according to claim 15, wherein said stop layer reduces an etch rate after an etch removal of an overlying lateral portion of the last fill layer.

17. A method according to claim 11, wherein the exposed trench bottom, after restricting the first fill layer into two lateral layer portions extending substantially parallel to the trench walls, has less a width compared to a width of a trench bottom prior to the fill step or a width of an initial trench bottom.

18. A method according to claim 11, wherein, depending on a magnitude of the voltage to be blocked, a sequence is continued until said trench is completely filled by alternatingly incorporating insulating layers and fill layers.

19. A method according to claims 18 and 11, wherein at least two further insulating layers and at least one further fill layer are incorporated by restricting the previously incorporated fill layer.

20. A method according to claim 19, wherein the step of restriction is accomplished by opening the fill layer down to the bottom of the trench, for forming new vertical trench walls.

21. A method according to claim 20, wherein the new trench walls are more closely spaced to each other and more closely disposed at the center of the trench compared to previously existing trench walls which are covered with the previously incorporated insulating layers.

* * * * *